United States Patent
Abouhatsira

(10) Patent No.: US 10,939,595 B1
(45) Date of Patent: Mar. 2, 2021

(54) EMF/RF RADIATION SHIELDING MEANS

(71) Applicant: Ornan Abouhatsira, Hong Kong (HK)

(72) Inventor: Ornan Abouhatsira, Hong Kong (HK)

( * ) Notice: Subject to any disclaimer, the term of this patent is extended or adjusted under 35 U.S.C. 154(b) by 0 days.

(21) Appl. No.: 17/002,458

(22) Filed: Aug. 25, 2020

(51) Int. Cl.
*H05K 9/00* (2006.01)
*D04H 13/00* (2006.01)
*D03D 1/00* (2006.01)

(52) U.S. Cl.
CPC ........... *H05K 9/009* (2013.01); *D03D 1/0058* (2013.01); *D04H 13/00* (2013.01); *H05K 9/0043* (2013.01)

(58) Field of Classification Search
CPC .................................................. H05K 9/0043
See application file for complete search history.

(56) References Cited

U.S. PATENT DOCUMENTS

| | | | | |
|---|---|---|---|---|
| 4,684,762 | A * | 8/1987 | Gladfelter | D03D 15/00 174/36 |
| 5,097,949 | A * | 3/1992 | Heldwein | B32B 7/02 206/720 |
| 6,011,504 | A * | 1/2000 | Tan | H05K 9/0001 342/4 |
| 2005/0118366 | A1* | 6/2005 | Piemonte | H05K 9/009 428/34.1 |
| 2007/0142103 | A1* | 6/2007 | Livne | G06F 1/1628 455/575.5 |
| 2009/0067150 | A1* | 3/2009 | Ito | H05K 9/0043 361/818 |
| 2012/0228020 | A1* | 9/2012 | Winch | H05K 9/0043 174/378 |
| 2013/0277101 | A1* | 10/2013 | Judy | H05K 9/0043 174/378 |
| 2014/0020946 | A1* | 1/2014 | Winch | H05K 9/0015 174/353 |
| 2014/0177196 | A1* | 6/2014 | Kumar | H05K 9/0052 361/816 |
| 2014/0190841 | A1* | 7/2014 | Nash | A45C 11/00 206/37 |
| 2015/0289421 | A1* | 10/2015 | Ho | H05K 9/0043 361/679.21 |
| 2019/0307026 | A1* | 10/2019 | Babhadiashar | H05K 9/0003 |

* cited by examiner

*Primary Examiner* — Hung V Ngo
(74) *Attorney, Agent, or Firm* — Birch, Stewart, Kolasch & Birch, LLP

(57) ABSTRACT

This invention provides an EMF/RF radiation shielding means including a conductive fabric enclosure functioned as a Faraday cage, a pair of flexible magnets for sealing the Faraday cage and a zipper to complete the closure and allow the two magnets to connect. The conductive fabric enclosure has a closable and openable top side, a left side, a right side and a closed bottom side. The conductive fabric enclosure is provided with two accommodations opposite to each other at its inner surface under and along the closable and openable top side. The pair of flexible magnets is respectively placed in the accommodations for connecting and sealing the Faraday cage. The zipper provides easy closing and opening to the enclosure, where the zipper closes it allows the two magnets to connect and when opening it allows easy access to the enclosure.

20 Claims, 3 Drawing Sheets

EMF/RF RADIATION SHIELDING MEANS

BACKGROUND OF THE INVENTION

Field of the Invention

The present invention relates to EMF (Electromagnetic Field)/RF (Radio Frequency) shielding means, and more particularly to an EMF/RF shielding enclosure for blocking EMF/RF radiation into and/or out of an interior of the enclosure.

Prior Art

There are many electronic devices/items transmitting EMF/RF radiation. EMF/RF radiation is claimed to be harmful to human bodies. Many people claim to be sensitive to this radiation. In current days, in order to protect from radiation and potential invasion to privacy and theft of property people need to place their devices like phones, car remote keys, key fobs, laptops, credit cards, etc. in a special Faraday bag that must be folded at the top and then sealed using Velcro to protect them from such radiation. This method of carrying and protecting devises is very inconvenience for everyday use since people do not always have the time to fold and unfold the bag. On other circumstances, there are cases where car thieves can use a devise to track the frequency from a car key that uses transmission and unlocks the car and steal it. Also, thieves can use a special Bluetooth scanner to find if a laptop is left inside the car and then they know whether they should break in to steal the laptop. Similarly, there are claims that it is possible to retract information using scanners from credit cards, passports with chips, tracking smartphones and more.

Hence this invention provides protection from radiation and protection to personal data and property.

SUMMARY OF THE INVENTION

Accordingly, an object of this invention is to provide a versatile, durable and easy-to-use shield means to protect people from EMF/RF radiation in the surrounding.

A further object of this invention is to provide an EMF/RF shielding means to block communication/transmission in or out of any electrical/electronic device enclosed in the EMF/RF shielding means to prevent remote accessing the information stored in electrical/electronic devices.

A still object of this invention is to forbid a car thief to track the car key frequency to unlock the car.

In one embodiment, the present invention provides an EMF/RF radiation shielding means, which comprises a conductive fabric enclosure functioned as a Faraday cage, a pair of flexible magnets for magnetically sealing the Faraday cage and a zipper that when closed will hold the magnets together which will close the enclosure and provide protection. The conductive fabric enclosure has a closable and openable top side for accessing an item into/from an interior of the enclosure, a left side, a right side and a closed bottom side. The inner surface of the conductive fabric enclosure under and along the closable and openable top side is provided with a pair of accommodations opposite to each other. The pair of flexible magnets is respectively placed in the accommodations for connecting and sealing the Faraday cage. The zipper which when opened will assist in separating the magnets and allow easy access to the content of the enclosure and when the zipper is closed it will allow the magnets to connect and seal the enclosure.

In a further embodiment, the present invention provides an EMF/RF radiation shielding backpack, which comprises an accommodation body having an outer layer, a lining and an EMF/RF radiation shielding means of the present invention placed between the outer layer and the lining.

In a further embodiment, the present invention provides an EMF/RF radiation shielding cover, which comprises a housing body having a conductive fabric enclosure functioned as a Faraday cage and having a closable and openable entrance, a pair of flexible magnets and a zipper. An inner surface of the conductive fabric enclosure along the closable and openable entrance is provided with a pair of accommodations opposite to each other. The pair of flexible magnets is respectively placed in the accommodations for sealing the Faraday cage. The zipper is to complete the closure of the conductive fabric enclosure and allow the two flexible magnets connect to each other.

In an implementation, the EMF/RF radiation shielding cover is a tent-like cover.

In an implementation, the conductive fabric enclosure is made of metalized polymer material.

In an implementation, the zipper is provided alongside the closable and openable top side and above the accommodations for closing the closable and openable top side.

In an implementation, the zipper has a length longer than a length of the closable and openable top side.

In an implementation, the closable and openable top side is extended from a section of the left side of the conductive fabric enclosure to a section of the right side thereof.

In an implementation, the accommodation has a length approximate to a length of the closable and openable top side.

In an implementation, the conductive fabric enclosure is non-woven fabric or woven fabric.

In an implementation, both of the left side and the right side of the conductive fabric enclosure are stitching sides.

In an implementation, both of the left side and the right side of the conductive fabric enclosure are stitched by conductive threads.

In an implementation, a stitching density of each of the left side and the right side of the conductive fabric enclosure is 10-24 stitches/per inch.

In an implementation, the flexible magnet is a flexible rubber magnet.

In an implementation, the flexible magnet is a magnet coated with a PVC film.

In an implementation, the flexible magnets are flexible magnet strips with a length longer than that of the closable and openable top side.

In an implementation, the flexible magnets are flexible magnet strips with a length approximate to that of the closable and openable top side.

DETAILED DESCRIPTION OF PREFERRED EMBODIMENTS OF THE INVENTION

The purpose of following embodiments/variances with reference to accompanying drawings is to explain and illustrate the present invention. It should be noted that the following embodiments/variances and accompanying drawings are intended to be illustrative but not limiting thereto. An ordinarily skill person in the art should understand similar structure feature may be called in different terms in the field. Hence, any structure has similar function as the structure feature described in the present invention should be included in the scope of the present disclosure. The drawings of the embodiments/variances of the present invention are not necessarily conform to the sizes and dimension ratios of actual structures, and more specifically, some features may be magnified or scaled down to show details of particular components. Besides, the accompanying drawings may be simplified for clarity, for example, each part and/or portion and/or detailed structure of a given embodiment may not be plotted in the accompanying drawings.

Figure 1:
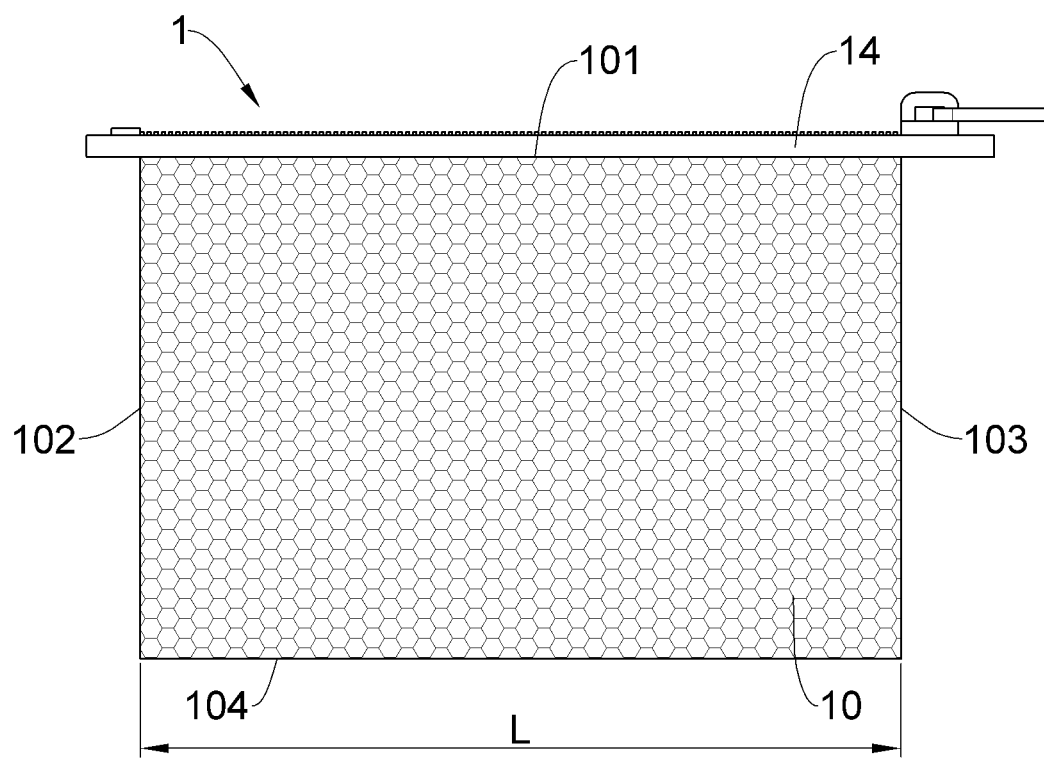
FIG. 1 shows a schematic front view of an EMF/RF radiation shielding means according to an embodiment of the present invention.
Figure 2:
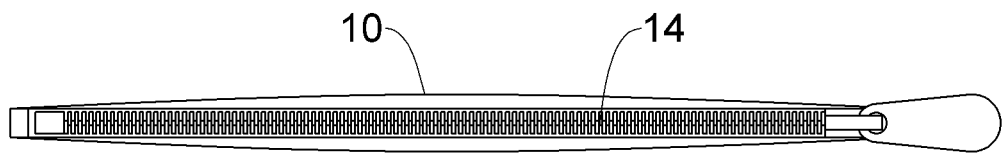
FIG. 2 shows a schematic top view of the EMF/RF radiation shielding means of FIG. 1 in a closed state.
Figure 3:
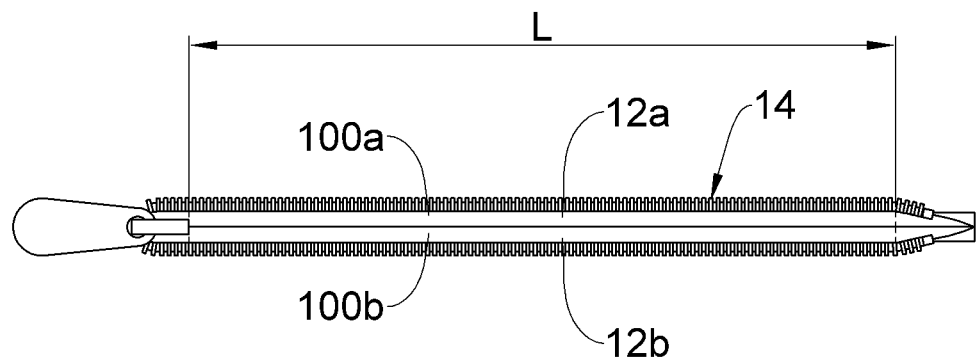
FIG. 3 shows a schematic top view of the EMF/RF radiation shielding means of FIG. 1 with magnetic sealing at its top side where a zipper is pulled down.
Figure 4:
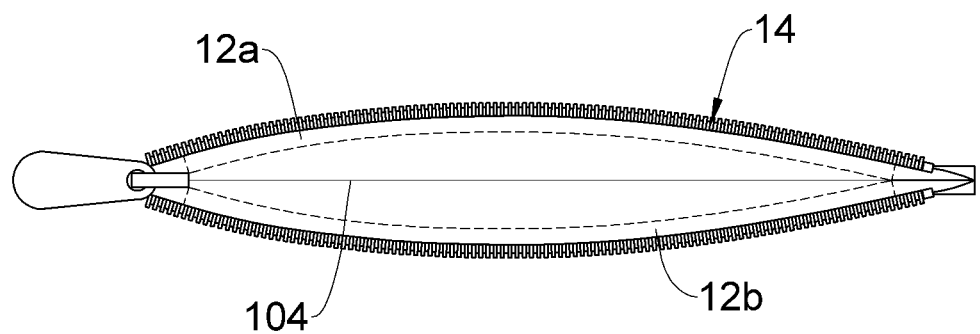
FIG. 4 shows a schematic top view of the EMF/RF radiation shielding means of FIG. 1 in an open state.

Please refer to FIG. 1 showing a schematic front view of an EMF/RF radiation shielding means 1 according to an embodiment of the present invention. FIG. 2 shows a schematic top view of the EMF/RF radiation shielding means 1 in a closed state. FIG. 3 shows a schematic top view of the EMF/RF radiation shielding means 1 with magnetic sealing at its top side where a zipper is pulled down. FIG. 4 shows a schematic top view of the EMF/RF radiation shielding means 1 in an open state.

The EMF/RF radiation shielding means 1 primarily comprises a conductive fabric enclosure 10, a pair of flexible magnets 12a, 12b and a zipper 14. The conductive fabric enclosure 10 is generally a rectangular-shape bag. In an implementation, the conductive fabric enclosure 10 may be configured as a rectangular-shape bag with round corners. It is to be understood that many various sizes, shapes and configurations of the present conductive fabric enclosure are possible relying on demand and purpose. The conductive fabric enclosure 10 is functioned as a Faraday cage and made of metallized polymer material. In an implementation, the conductive fabric enclosure 10 contains a fabric material such as cotton, polyester, nylon, acrylic, or other fabrics combined with one or more of nickel, copper, silver and cobalt, etc. In an implementation of this invention, the conductive fabric enclosure 10 is made of a composition of 60 wt. % polyester, around 25 wt. % metallic copper and around 15 wt. % metallic nickel. The percentages of the composition are approximate and can vary by 5-7 wt. % above or below the mentioned values due to manufacturing abilities. The conductive fabric enclosure 10 may have non-woven fabric material or woven fabric material. The conductive fabric enclosure 10 has a closable and openable top side 101, a left side 102, a right side 103 and a closed bottom side 104. A user can access an article or item like an electrical or electronic device into or out of an interior of the conductive fabric enclosure 10 via the closable and openable top side 101. The conductive fabric enclosure 10 is provided with two accommodations 100a, 100b, for example two enclosed sleeves, at its inner surface under the closable and openable top side 101. The two accommodations 100a, 100b are formed opposite to each other along the closable and openable top side 101. The two accommodations 100a, 100b are extended from a left end of the closable and openable top side 101 connecting the left side 102 to a right end of the closable and openable top side 101 connecting the right side 103. In other words, the length of each of the two accommodations 100a, 100b is equal to or longer than a length L of the closable and openable top side 101. The flexible magnets 12a, 12b are respectively placed inside the accommodations 100a, 100b to hold them in place in order to connect and magnetically seal the Faraday cage. The flexible magnets 12a, 12b may be flexible magnet strips with a length L hidden in the accommodations 100a, 100b along the closable and openable top side 101. The flexible magnets 12a, 12b may have a length fitting with that of the accommodation 100a, 100b to make sure a high level of magnetic sealing of the conductive fabric enclosure 10. In an implementation of the present invention, top portions of the conductive fabric enclosure 10 can be folded and stitched to form two sleeves inside the conductive fabric enclosure 10. The flexible magnets 12a, 12b are respectively slid in the two sleeves. Then, the two sleeves are closed by any known means to become two enclosed sleeves used as the two accommodations 100a, 100b. The flexible magnets 12a, 12b can be flexible rubber magnets, for example, which are made with rubber and NdFeb (Neodymium) magnet powder. The flexible magnets 12a, 12b also can be magnets coated with a thin PVC (Polyvinylchloride) film to protect the flexible magnets 12a, 12b from becoming rusty after prolonged use and exposure to water/humidity. An artisan in the field of this invention will appreciate flexible magnets made with any proper material providing magnetic strength mating with the present conductive fabric enclosure are possible. In an implementation, the left side 102 and the right side 103 of the conductive fabric enclosure 10 are stitched with conductive threads to form stitching sides to create complete shielding of the conductive fabric enclosure 10 from EMF/RF radiation. In an implementation, a stitching density for the left side 102 and the right side 103 is 10-24 stitches/per inch. The zipper 14 is sewn to the conductive fabric enclosure 10 along the closable and openable top side 101 and above the accommodations 100a, 100b that receive the flexible magnets 12a, 12b. The zipper 14 has a length longer than the length L of the closable and openable top side 101. The zipper 14 is used to close the closable and openable top side 14. When the zipper 14 is zipped up to close the conductive fabric enclosure 10 the way as all bags work, the flexible magnets 12a, 12b connect to each other and then magnetically sealing the Faraday cage formed of the conductive fabric enclosure 10. Hence, the circuit of the Faraday cage is closed. The EMF/RF radiation shielding means 1 blocks EMF/RF radiation into and out of the conductive fabric enclosure 10 according to the Faraday cage principle. In an implementation, the zipper 14 may be made of plastic material or metallic material.

When a user places any electric or electronic device emitting or receiving EMF/RF radiation in the EMF/RF radiation shielding means 1, no communication/transmission goes in or out, the EMF/RF radiation shielding means 1 which protects the user from exposure to the EMF/RF radiation or theft of personal information or property. So, the EMF/RF radiation shielding means 1 can provide protection to people's health and protection to digital information and property.

Figure 5:
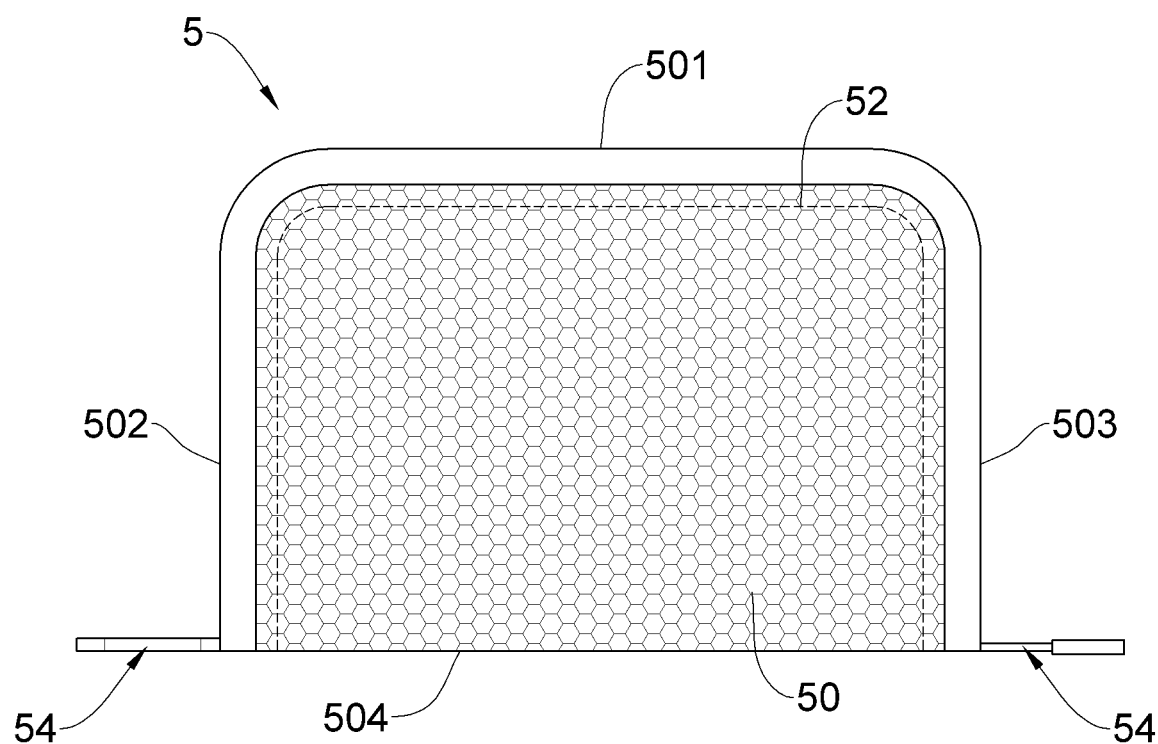
FIG. 5 shows a schematic front view of an EMF/RF radiation shielding means according to another embodiment of the present invention.

FIG. 5 shows a schematic front view of an EMF/RF radiation shielding means 5 according to another embodiment of the present invention. The EMF/RF radiation shielding means 5 comprises a conductive fabric enclosure 50 functioned as a Faraday cage, a pair of flexible magnet strips 52 and a zipper 54. The conductive fabric enclosure 50 is substantially a rectangular-shape receiving body having upper round corners and confined by a top side 501, a left side 502, a right side 503 and a closed bottom side 504. A closable and openable section of the conductive fabric enclosure 50 is defined by the top side 501, the left side 502 and the right side 503. The inner surface of the conductive fabric enclosure 50 beginning from a bottom of the left side 502 passing the top side 501 ended at a bottom of the right side 503 is provided with a pair of accommodations opposite to each other. The pair of the flexible magnet strips 52 are placed and hidden in the accommodations, respectively. The zipper 54 is provided alongside the closable and openable section and outside or above the accommodations for closing the closable and openable section. In an implementation of this invention, the closable and openable section of the conductive fabric enclosure 50 may be defined by the top side 501, a section of the left side 502 and a section of the right side 503. The pair of accommodations is provided at the inner surface of the conductive fabric enclosure 50 along its closable and openable section. Like the conductive fabric enclosure 10 shown in FIG. 1, when the zipper 54 is zipped up to close the conductive fabric enclosure 50 the way as all bags work, the flexible magnet strips 52 connect to each other and then magnetically sealing the Faraday cage formed of the conductive fabric enclosure 50. From the disclosure of this invention, one skilled artisan in the field would appreciate the materials of the conductive fabric enclosure 10, the flexible magnet 12a, 12b and the zipper 14, as well as means to form the accommodations are applicable to the EMF/RF radiation shielding means 5.

From the disclosure of this invention, one skilled artisan in the field would appreciate the length of the flexible magnet is preferably approximate to the length of the accommodation of the present conductive fabric enclosure, i.e. the length of the flexible magnet fits with that of the accommodation, and the accommodation is preferably longer than the closable and openable section of the conductive fabric enclosure to make sure there is high level of magnetic sealing. For example, the length of the flexible magnets will likely be as long as the zipper which is usually longer than the actual closable and openable section.

Figure 6:
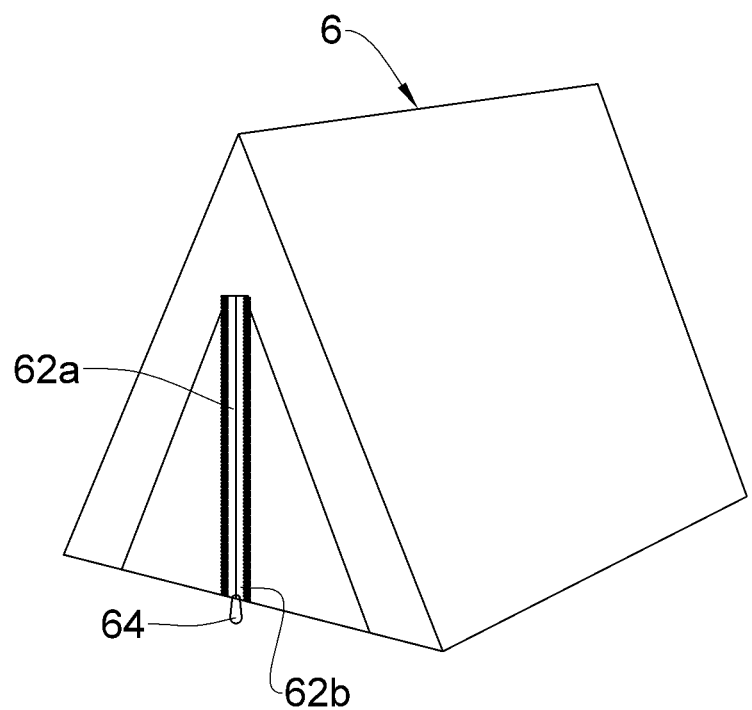
FIG. 6 shows a schematic perspective view of a tent-like EMF/RF radiation shielding cover with magnetic sealing at its entrance where a zipper is pulled down according to another embodiment of the present invention.

FIG. 6 shows a schematic perspective view of a tent-like EMF/RF radiation shielding cover 6 with magnetic sealing at its entrance where a zipper is pulled down according to another embodiment of the present invention. A closable and openable entrance of the tent-like EMF/RF radiation shielding cover 6 is provided with a pair of flexible magnet strips 62a, 62b and a zipper 64 with their arrangement and configuration like the flexible magnets 12a, 12b and the zipper 14 shown in FIG. 3. The tent-like EMF/RF radiation shielding cover 6 can be used to protect people staying inside from EMF/RF radiation or cover a large assembly placed inside to block EMF/RF interference. One skilled artisan in the field would appreciate any disclosure of this invention is also applicable to the tent-like EMF/RF radiation shielding cover 6.

As discussed in the above, the EMF/RF radiation shielding means of the present invention can be made in various sizes and shapes for proper use. For example, its conductive fabric enclosure can be configured and made in a form of a sheath suitable for receiving a mobile phone or in a suitable size for carrying a laptop. Specifically, the conductive fabric enclosure can be configured and made as a phone sleeve, a tablet sleeve, a key fob bag, a phone bag, a tablet bag, a pouch, a TOTE, a backpack, or a briefcase etc. In an implementation of this invention, the EMF/RF radiation means can be modified and designed to become a backpack. For example, the backpack can have a bag body having an outer layer like used in well-known high quality bags and the conductive fabric enclosure 10 can be used between the outer layer and a lining. An artisan in the field of this invention will appreciate the phone sleeve, tablet sleeve, key fob bag, phone bag, tablet bag, pouch, TOTE and the case also can be made in a way like the backpack from the disclosure of the above. The backpack provided with the present EMF/RF radiation shielding enclosure design allows people to use the backpack like a normal bag and they can simply drop their keys, wallet with credit cards, passport, phone, laptop, etc. inside the backpack, and once the zipper is closed they know their devices cannot be accessed by anyone using trackers, scanners, or card readers, etc.

The present EMF/RF radiation shielding means also can be useful for law enforcement agencies where they enter crime scenes they have to collect and protect phone and tablets from any remote access until they take them to the laboratory for examination. The present EMF/RF radiation shielding means will make itself easy to carry and will protect the items collected in the conductive fabric enclosure from being remotely controlled or accessed. The present EMF/RF radiation shielding means is also applicable in some areas as working for government agents that do not want to be tracked, or as business meeting where attendees do not know whether their devices have been accessed or whether information has been uploaded or downloaded.

The foregoing description only embodies the present invention, not used to limit the scope and range of the present invention. Those equivalent changes or modifications made according to the shape, structure, feature, or spirit described in the claims of the present invention are included in the appended claims of the present invention.

What is claimed is:

1. An EMF/RF radiation shielding means comprising:
   a conductive fabric enclosure functioned as a Faraday cage having a closable and openable top side for accessing an item into/from an interior of the conductive fabric enclosure, a left side, a right side and a closed bottom side, an inner surface of the conductive fabric enclosure under and along the closable and openable top side is provided with a pair of accommodations opposite to each other;
   a pair of flexible magnets respectively placed in the accommodations for sealing the Faraday cage; and
   a zipper to complete the closure of the conductive fabric enclosure and allow the two flexible magnets connect to each other.

2. The EMF/RF radiation shielding means of claim 1, wherein the conductive fabric enclosure is made of metalized polymer material.

3. The EMF/RF radiation shielding means of claim 2, wherein a composition of the conductive fabric enclosure includes 60 wt. % polyester, 25 wt. % copper and 15 wt. % nickel.

4. The EMF/RF radiation shielding means of claim 1, wherein the zipper is provided alongside the closable and openable topside and above the accommodations for closing the closable and openable top side.

5. The EMF/RF radiation shielding means of claim 4, wherein the zipper has a length longer than a length of the closable and openable top side.

6. The EMF/RF radiation shielding means of claim 1, wherein each of a left end and a right end of the closable and openable top side are extended to a respective section of the left side and right side of the conductive fabric enclosure so that a closable and openable section is defined by the respective section of the left side, the closable and openable top side and the respective section of the right side.

7. The EMF/RF radiation shielding means of claim 6, wherein the zipper is provided alongside the closable and openable section and above the accommodations foreclosing the closable and openable section.

8. The EMF/RF radiation shielding means of claim 6, wherein the accommodation has a length equal to or longer than a length of Zipper.

9. The EMF/RF radiation shielding means of claim 8, wherein the flexible magnets are flexible magnet strips with a length fitting with the accommodation.

10. The EMF/RF radiation shielding means of claim 1, wherein the accommodation has a length equal to or longer than a length of the Zipper.

11. The EMF/RF radiation shielding means of claim 10, wherein the flexible magnets are flexible magnet strips with a length fitting with that of the accommodation.

12. The EMF/RF radiation shielding means of claim 1, wherein a fabric material of the conductive fabric enclosure is non-woven fabric or woven fabric.

13. The EMF/RF radiation shielding means of claim 1, wherein both of the left side and the right side of the conductive fabric enclosure a stitching sides.

14. The EMF/RF radiation shielding means of claim 13, wherein both of the left side and right side of the conductive fabric enclosure are stitched by conductive threads.

15. The EMF/RF radiation shielding means of claim 14, wherein a stitching density of each of the left side and right side of the conductive fabric enclosure is 10-24 stitches/per inch.

16. The EMF/RF radiation shielding means of claim 1, wherein the flexible magnet is a flexible rubber magnet.

17. The EMF/RF radiation shielding means of claim 1, wherein the flexible magnet is a magnet coated with a PVC film.

18. An EMF/RF radiation shielding backpack, comprising:
    a bag body having an outer layer, a lining and an EMF/RF radiation shielding means as claimed in claim 1 between the outer layer and the lining.

19. An EMF/RF radiation shielding cover, comprising
    a housing body having a conductive fabric enclosure functioned as a Faraday cage and having a closable and openable entrance; wherein an inner surface of the conductive fabric enclosure along the closable and openable entrance is provided with a pair of accommodations opposite to each other:
    a pair of flexible magnets respectively placed in the accommodations for sealing the Faraday cage; and
    a zipper to complete the closure of the conductive fabric enclosure and allow the two flexible magnets connect to each other.

20. The EMF/RF radiation shielding cover of claim 19, wherein the zipper has a length longer than the closable and openable entrance and the flexible magnet has a length equal to or longer than that of the zipper.

* * * * *